United States Patent [19]

Ryu

[11] Patent Number: 5,426,431
[45] Date of Patent: Jun. 20, 1995

[54] ANALOG/DIGITAL CONVERTER
[75] Inventor: Kazuo Ryu, Tokyo, Japan
[73] Assignee: NEC Corporation, Tokyo, Japan
[21] Appl. No.: 149,086
[22] Filed: Nov. 9, 1993
[30] Foreign Application Priority Data
  Nov. 9, 1992 [JP] Japan .................... 4-297522
[51] Int. Cl.6 ............................................ H03M 1/38
[52] U.S. Cl. .................................... 341/158; 341/161
[58] Field of Search ............... 341/158, 155, 159, 161, 341/144, 150, 172

[56] References Cited
U.S. PATENT DOCUMENTS
4,385,286  5/1983  Haque .................... 341/108
5,038,143  8/1991  Hester .................... 341/110

Primary Examiner—Brian K. Young

[57] ABSTRACT

Disclosed is an analog/digital (A/D) converter, which comprises an M-bit resistor-string type digital/analog (D/A) converter, a charge re-distribution type N-bit D/A converter, a comparator, a successive approximation register for storing the output of the comparator, and first and second switch controllers for respectively controlling the two D/A converters in accordance with the output of the successive approximation register. The N-bit D/A converter uses voltages at both ends a and b of an arbitrary unit resistor of the resistor string of the M-bit D/A converter as reference voltages. The comparator has a differential amplifier whose one input terminal is connected to a capacitor for sampling an analog input signal. The output of the N-bit D/A converter is connected to the other input terminal of the differential amplifier. As the differential amplifier is used in the comparator and the N-bit D/A converter of a charge re-distribution type is used instead of a resistor-string type, the number of components and the area of the A/D converter can be reduced considerably. Even if the number of bits increases, therefore, an increase in pellet area will be suppressed.

13 Claims, 6 Drawing Sheets

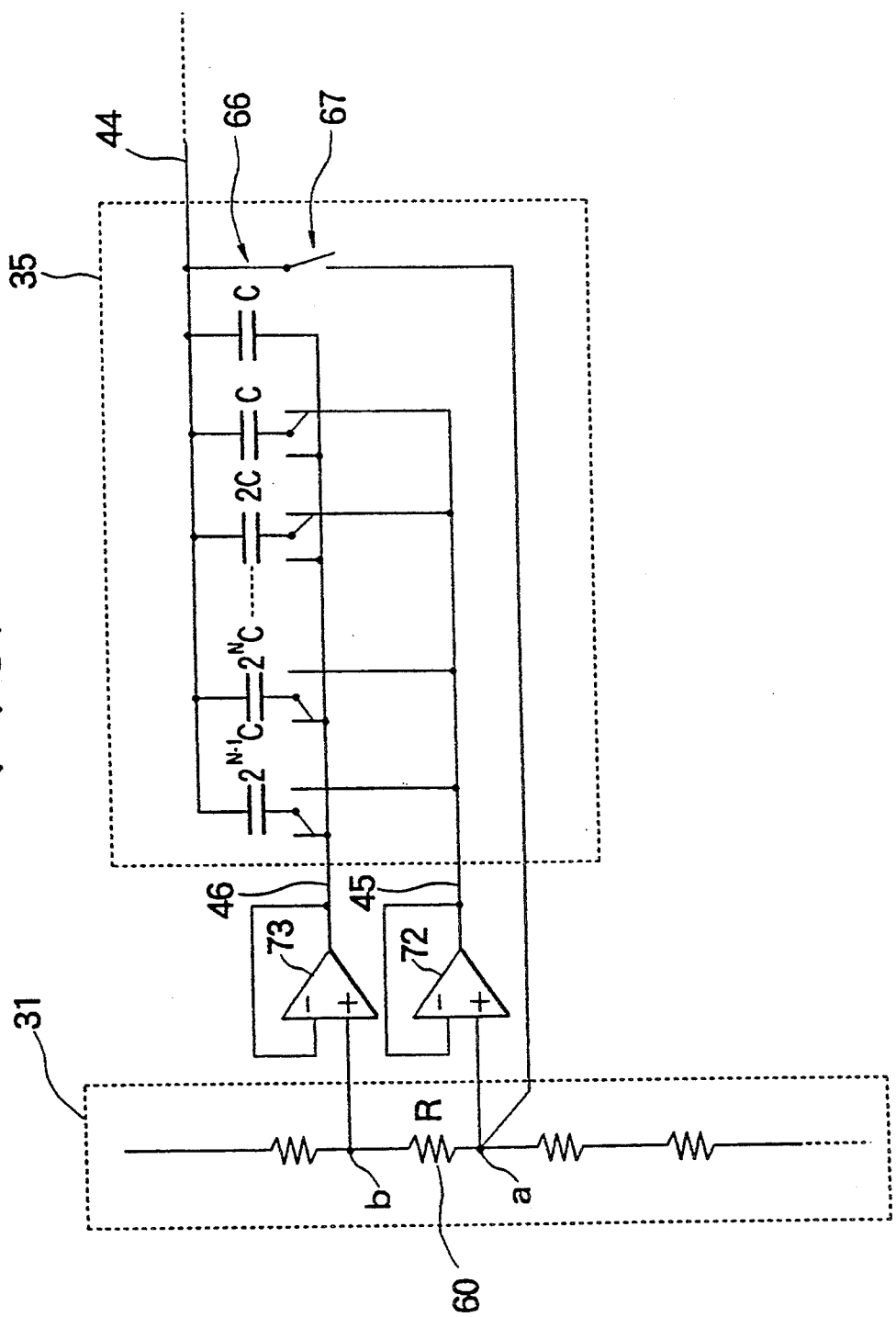

ANALOG/DIGITAL CONVERTER

BACKGROUND OF THE INVENTION

1. Field of the Invention

The present invention relates to an analog/digital converter, and, more particularly, to a monolithic analog to digital converter (hereinafter called "A/D converter") which is fabricated by the MOS technology.

2. Description of the Related Art

Conventionally, a successive approximation type A/D converter is known as an A/D converter fabricated by the MOS technology.

FIG. 1 is a circuit exemplifying this conventional successive approximation type A/D converter. As shown in FIG. 1, the conventional successive approximation type A/D converter includes a resistor-string type digital to analog converter (D/A converter) 1. This D/A converter 1 has a plurality of resistors 5 (resistance R) connected in series, and a plurality of switches 6 each of which selectively acquires the voltage across the associated resistor 5. The A/D converter equipped with this D/A converter 1 further has a comparator 2, a successive approximation register 3 and a switch controller 4. The comparator 2 sequentially compares an analog signal input to an analog input terminal 7 and supplied to the comparator 2 via a switch 8, with the output of the D/A converter 1, input via a switch 9. The successive approximation register 3 holds the output of the comparator 2. The switch controller 4 controls the individual switches of the D/A converter 1 based on the output of the successive approximation register 3.

While this conventional A/D converter can advantageously permit an easy simple increase in the number of bits, the increase in the number of bits inevitably increases the chip area. More specifically, this conventional A/D converter requires $2^N$ resistors 5 and $(2^{N+1}-2)$ switches 6 in the case of N bits, and an increase in the number of bits significantly increase the chip area.

In this respect, therefore, there is a demand for an A/D converter, which has the advantage and feature of the resistor-string system and has a circuit structure to suppress an increase in the chip area.

FIG. 2 is a circuit diagram showing another conventional A/D converter designed to suppress an increase in the chip area. As shown in FIG. 2, this A/D converter includes an M-bit D/A converter 11 having a string of unit resistors 25 of a resistance R and a plurality of switches (not shown in FIG. 2) each of which selectively acquires the voltage across the associated resistor, and an N-bit D/A converter 15 having series-connected resistors 26 of a resistance $R/2^N$. A comparator 12 has a differential amplifier 22, a capacitor 20 connected between one input terminal of the comparator 12 and one input terminal of the differential amplifier 22, and a switch 21 connected between a pair of input terminals of the differential amplifier 22. The output of this comparator 12 is input to a successive approximation register 13. The output of the successive approximation register 13 is input to a first switch controller 14 and a second switch controller 16. The first switch controller 14 controls the switches of the D/A converter 11 and leads the output of the D/A converter 11 via an output line 23 to the aforementioned one input terminal of the comparator 12. A switch 19 is provided to this output line 23. The second switch controller 16 controls the switches of the D/A converter 15 and leads the output of the D/A converter 15 via an output line 24 to the other input terminal of the comparator 12. An analog input terminal 17 is connected via a switch 18 to the aforementioned one input terminal of the comparator 12.

This A/D converter of n (=M+N) bits comprises the resistors and switches, the number of which is about $\frac{1}{2^N}$ compared to that of the simple resistor-string type n-bit A/D converter shown in FIG. 1.

FIG. 3 is a detailed configuration of the second D/A converter 15 shown in FIG. 2. As shown in FIG. 3, each resistor 26 of the second D/A converter 15 is constituted of $2^N$ unit resistors 25 of a resistance R connected in parallel.

To improve the precision of the above conventional A/D converter, the resolution of the N-bit second D/A converter 15 should be increased. Since the second D/A converter 15 has $2^N$ unit resistors 25 of a resistance R connected in parallel, the chip area inevitably increases as N increases.

SUMMARY OF THE INVENTION

It is therefore an object of the present invention to provide an analog/digital (A/D) converter which will suppress an increase in the circuit area even when the number of conversion bits increases.

The A/D converter according to the present invention comprises a first digital/analog converter including a first resistor string having unit resistors connected in series, and first switch means for selecting individual taps of said first resistor string and generating a first output signal of M bits (M being a natural number) as a reference to be compared with an analog input signal; reference-voltage supplying means for supplying voltages at both ends of an arbitrary one of said unit resistors in said first resistor string as reference voltages; a second digital/analog converter including N bits binary-weighted capacitive elements (N being a natural number) and second switch means for selectively connecting said binary-weighted capacitive elements to said reference-voltage supplying means to generate a second output signal; a comparator for comparing said analog input signal with said first and second output signals of said first and second digital/analog converters; a first controller for controlling said first digital/analog converter in accordance with an output of said comparator; and a second controller for controlling said second digital/analog converter in accordance with said output of said comparator, whereby upper M bits of (M+N) bits are subjected to analog/digital conversion by said first output signal of said first digital/analog converter and lower N bits are subjected to analog/digital conversion by said second output signal of said second digital/analog converter.

The A/D converter of this invention can ensure a greater number of bits and high precision without increasing the circuit area of the second D/A converter. In the case where an N-bit second D/A converter is constituted by the prior art, for instance, $2^{2N}$ unit resistors and $2^N$ switches are needed. According to this invention, however, such an N-bit second D/A converter simply requires $2^N$ switches and capacitors of a capacitance $2^N C$. Even assuming that a unit resistor and a unit capacitor has the same area, the area of the D/A converter is reduced to $\frac{1}{2^N}$ by this invention.

It is apparent that this invention can provide a low-cost A/D converter which is suitable for monolithic fabrication and will achieve large bits and high precision without enlarging the pellet area.

BRIEF DESCRIPTION OF THE DRAWINGS

FIG. 6 is a circuit diagram mainly showing first and second D/A converters of a second embodiment of this invention.

DETAILED DESCRIPTION OF THE PREFERRED EMBODIMENTS

Figure 1:
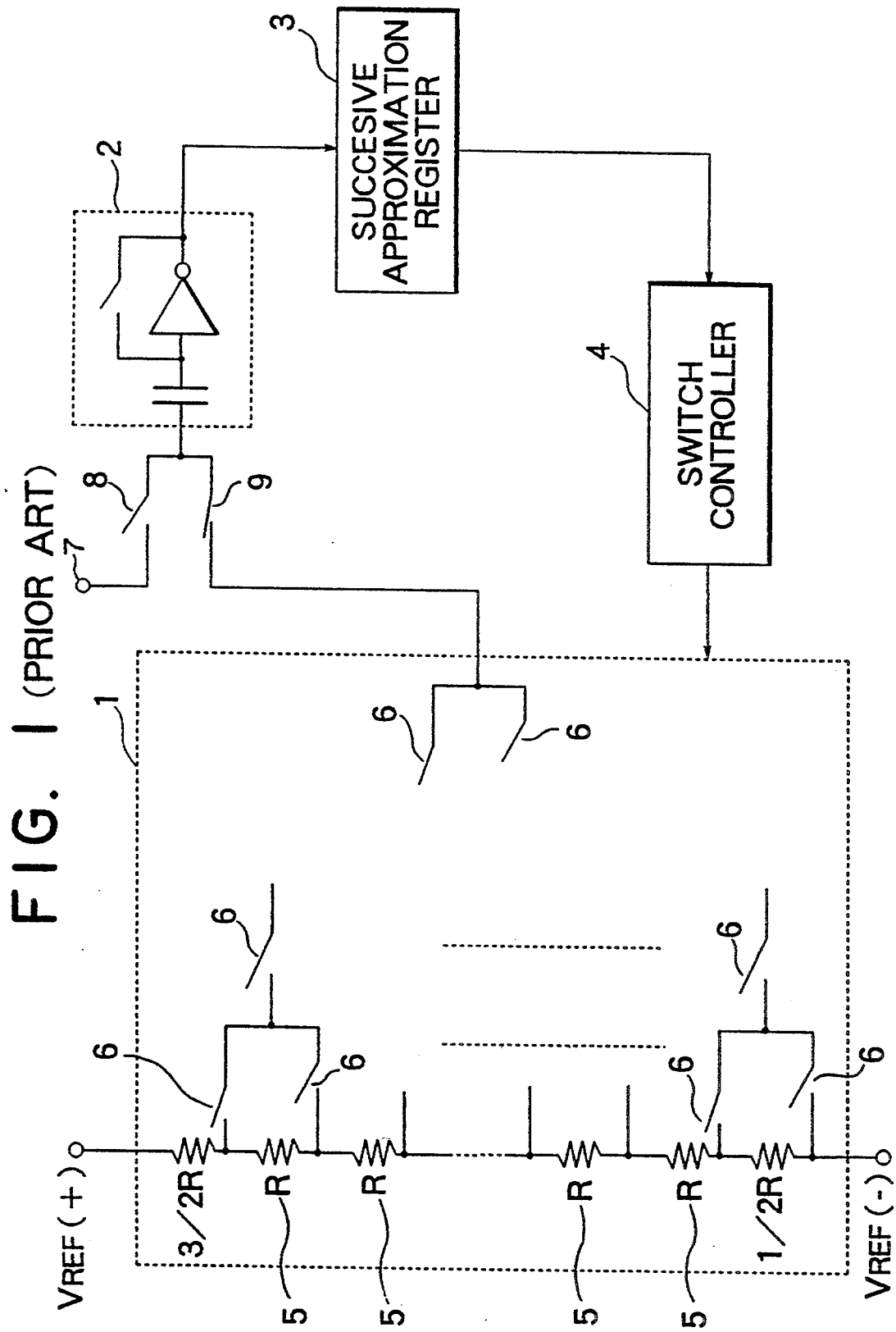
FIG. 1 is a diagram showing the structure of a first conventional A/D converter.
Figure 2:
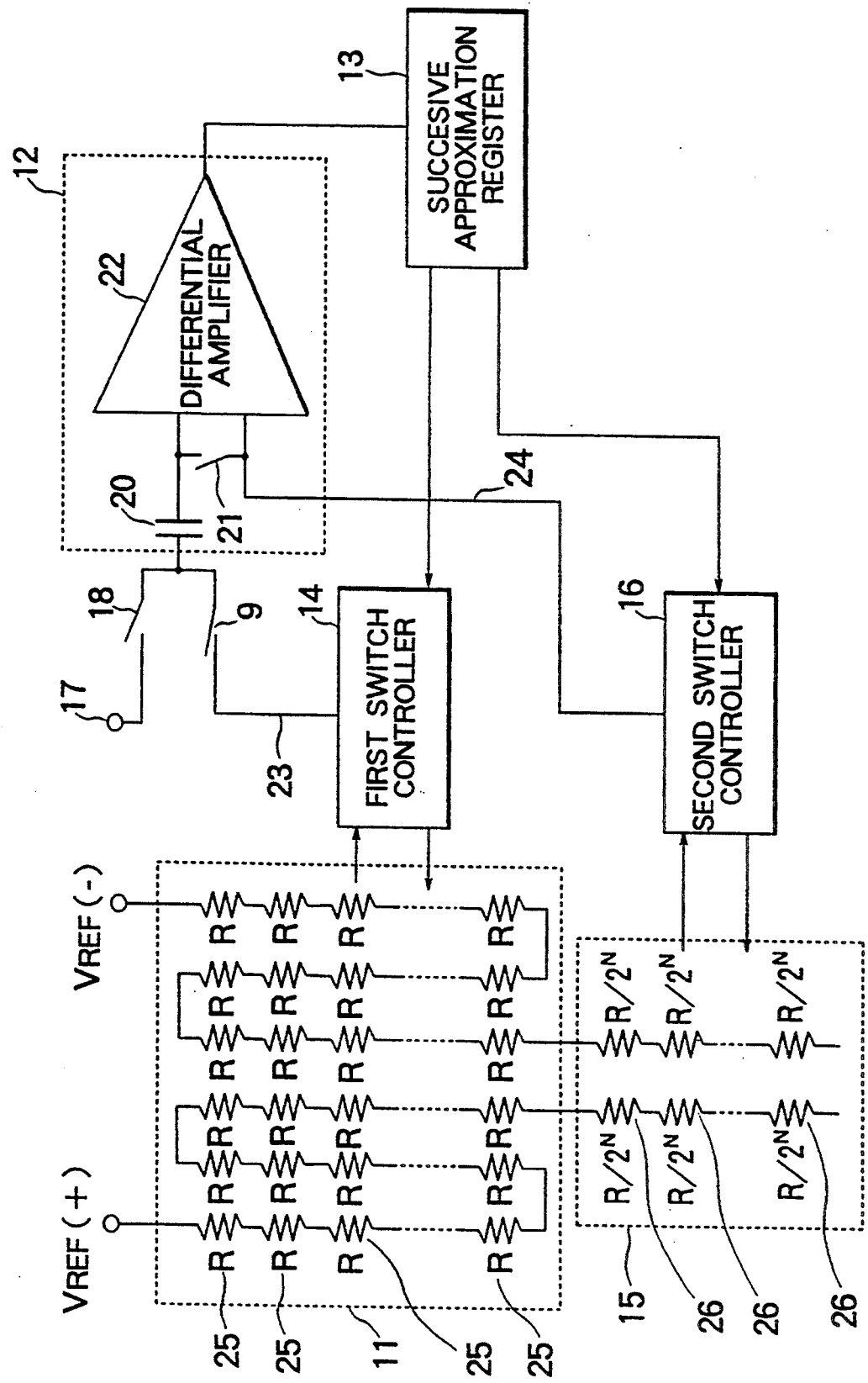
FIG. 2 is a diagram showing the structure of a second conventional A/D converter.
Figure 3:
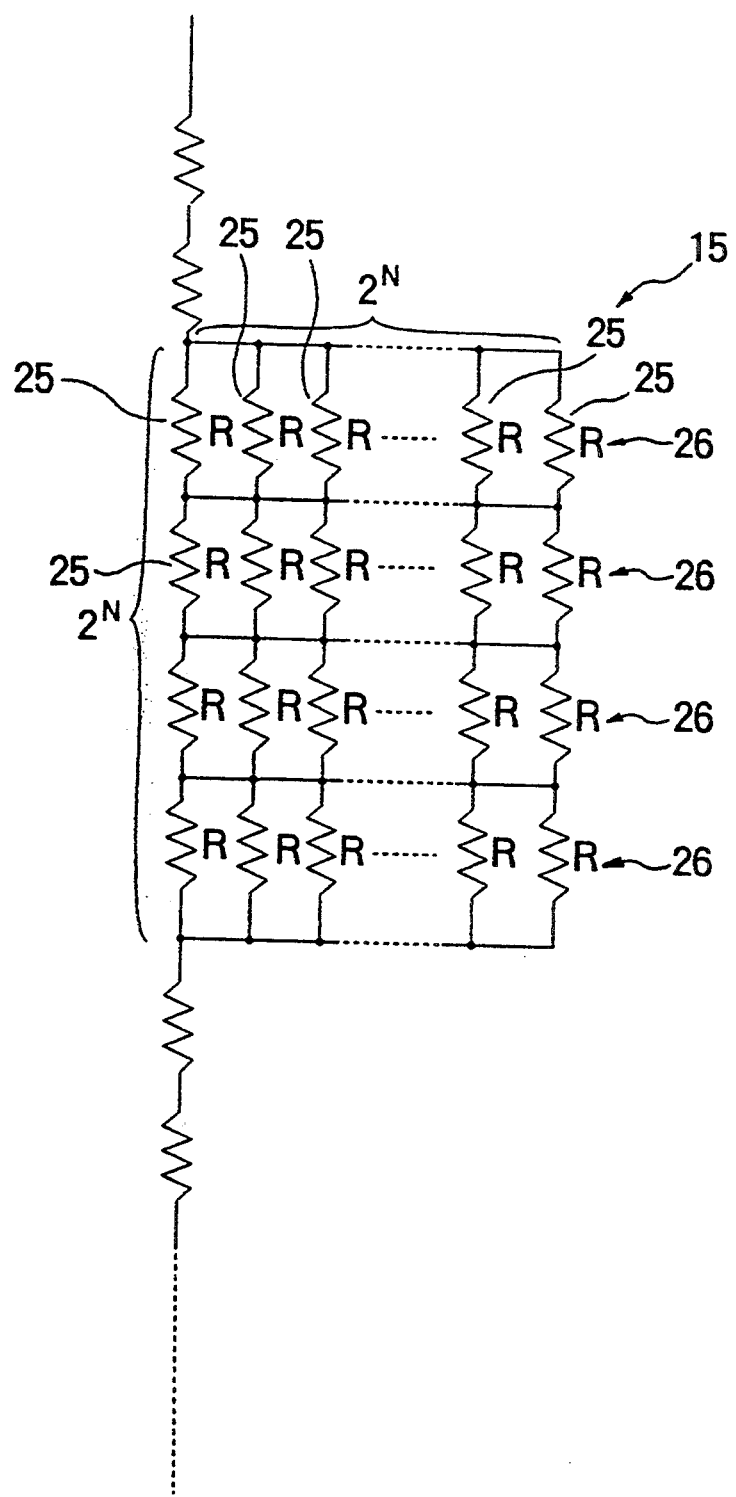
FIG. 3 is a detailed resistors configuration diagram of the second D/A converter shown in FIG. 2.
Figure 4:
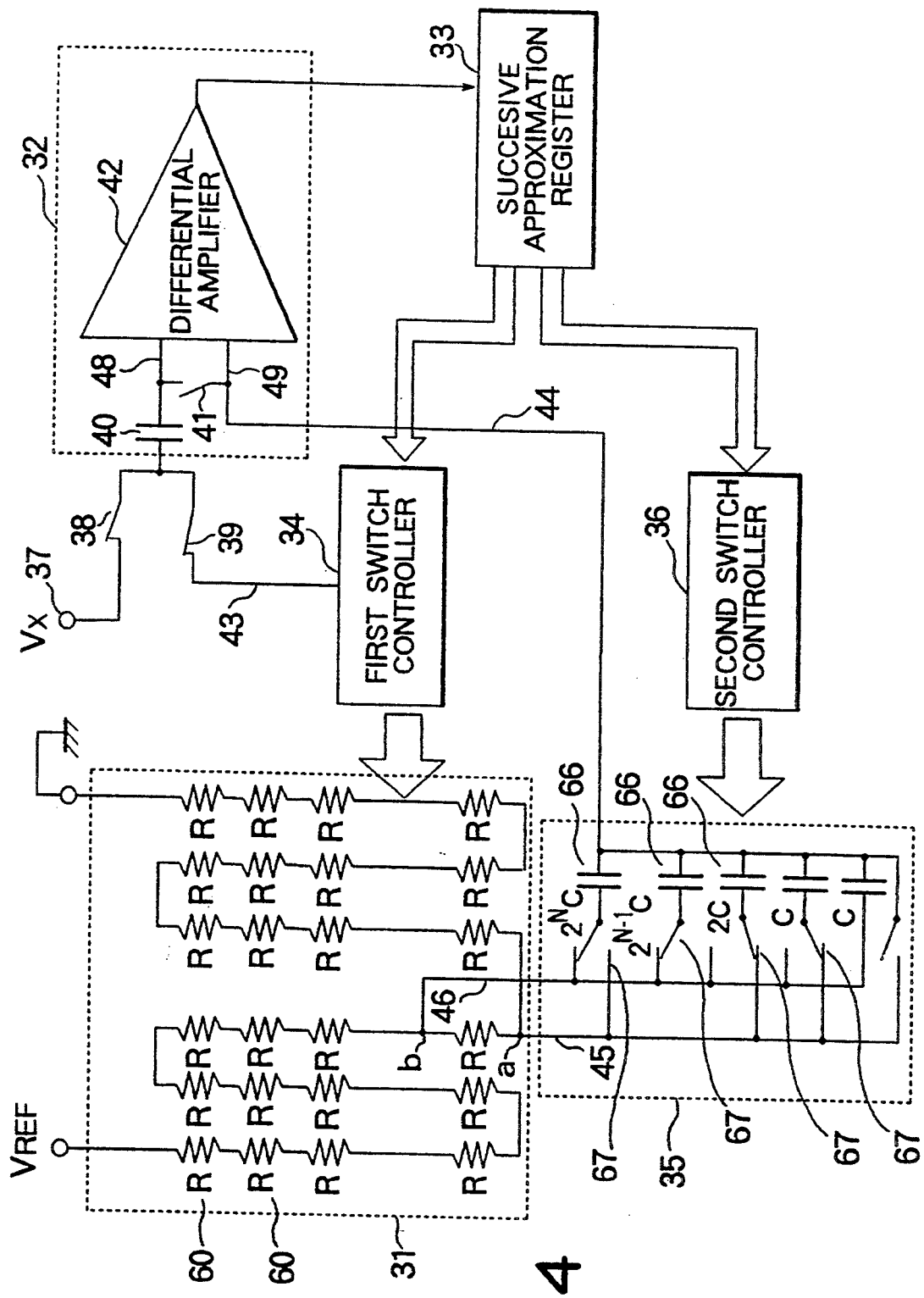
FIG. 4 is a diagram showing the structure of an A/D converter according to a first embodiment of the present invention.

Preferred embodiments of the present invention will now be described referring to the accompanying drawings. FIG. 4 illustrates the structure of an A/D converter according to a first embodiment of this invention. As shown in FIG. 4, the A/D converter of this embodiment comprises first and second D/A converters 31 and 35, first and second switch controllers 34 and 36, a comparator 32, and a successive approximation register 33. The first and second switch controllers 34 and 36 respectively control the first and second D/A converters 31 and 35. The comparator 32 compares an analog input from an analog input terminal 37 with the output of the second D/A converter 35 by means of a differential amplifier 42 and other components. The successive approximation register 33 holds the output of the comparator 32 and controls the first and second switch controllers 34 and 36.

The first D/A converter 31 includes a plurality of unit resistors 60 of a resistance R connected in series between a reference voltage source of $V_{REF}$ and the ground, and a plurality of switches (not shown in FIG. 4; see switching transistors 61 in FIG. 5) which selectively extract voltages divided by the unit resistors (R) 60.

The first switch controller 34 controls the switches of the first D/A converter 31 and supplies the output voltage of the first D/A converter 31 to one input terminal of the comparator 32 via an output line 43. A switch 39 is provided to this output line 43.

The second D/A converter 35 receives voltages at both nodes a and b of one unit resistor (R) 60 among the resistor string of the first D/A converter 31 as first and second reference voltages. The second D/A converter 35 comprises capacitors 66 having binary-weighted capacitances of C to $2^N C$, and switches 67, which selectively couple those capacitors 66 to the first and second reference voltages.

The second switch controller 36 controls the switches 67 of the second D/A converter 35 in response to a control signal from the successive approximation register 33.

The comparator 32 has the aforementioned differential amplifier 42, a capacitor 40 connected between one input terminal of the comparator 32 and one input 48 of the differential amplifier 42, and a switch 41 connected between that one input 48 of the differential amplifier 42 and the other input 49 thereof.

The successive approximation register 33 controls the first and second switch controllers 34 and 36 in accordance with the comparison result of the comparator 32.

An analog signal input to the analog input terminal 37 is supplied via a switch 38 to the capacitor 40, while the output of the first D/A converter 31 is supplied to the capacitor 40 via the output line 43 provided with the switch 39. The output of the second D/A converter 35 is supplied via an output line 44 to the other input 49 of the differential amplifier 42.

Figure 5:
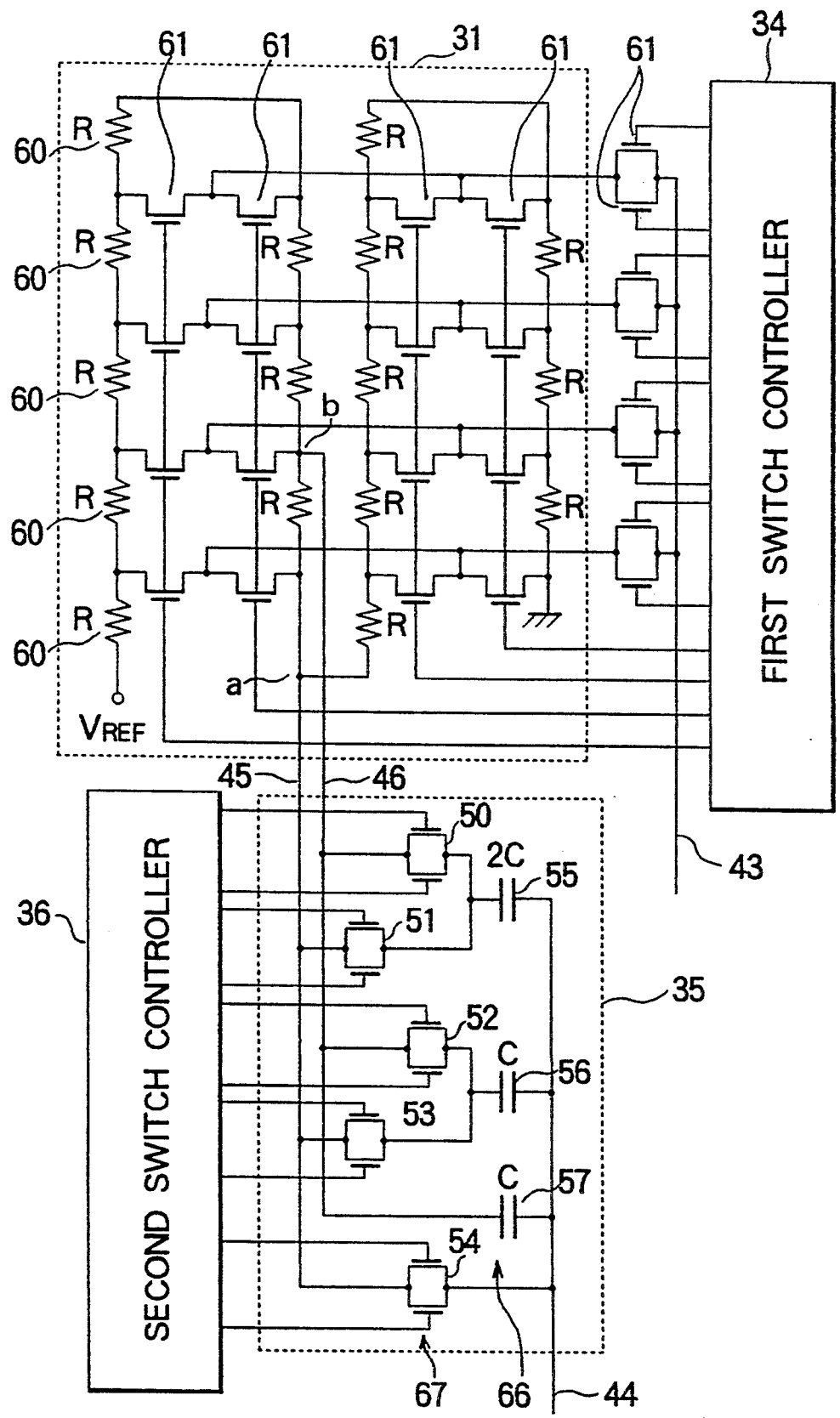
FIG. 5 is a detailed circuit diagram showing first and second D/A converters shown in FIG. 4.

FIG. 5 presents a detailed circuit diagram showing the first and second D/A converters 31 and 35 shown in FIG. 4. The circuit in FIG. 5 is for the case where the first D/A converter 31 has four bits (M=4) and the second D/A converter 35 has two bits (N=2). This first D/A converter 31 has sixteen unit resistors 60 of a resistance R and switching transistors 61 connected to nodes between those unit resistors 60. The individual switching transistors 61 are responsive to a signal from the first switch controller 34 and outputs divided voltages from the resistor string to the output line 43. Signal lines 45 and 46, led from a node "a" which is a mid point in the resistor string of the first D/A converter 31 and an adjoining node "b", are connected to the second D/A converter 35, and reference voltages Va and Vb are supplied to the second D/A converter 35 via those signal lines 45 and 46.

The second D/A converter 35 has switches 50 to 54, and binary-weighted capacitors 55 to 57 each having one end connected to the output line 44. The capacitor 55 has the other end connected to the switches 50 and 51, the capacitor 56 has the other end connected to the switches 52 and 53, and the capacitor 57 has the other end connected to the switches 50 and 52 via the signal line 46. Those switches 50 to 54 are switched in accordance with a signal from the second switch controller 36. The binary-weighted capacitor 55 has a capacitance of 2C, and the binary-weighted capacitors 56 and 57 has a capacitance of C.

The action of the A/D converter according to this embodiment will be described referring to FIGS. 4 and 5. First, an analog signal $V_X$, input to the analog input terminal 37, is sampled by the switches. At this time, the switches 41 and 54 are switched on, and the other end of the capacitor 40 is connected to the mid point (node a in FIGS. 4 and 5) of the resistor string of the first D/A converter 31. In other words, the capacitor 40 is biased by a voltage of $V_{REF}/2$.

When the switches 38 and 41 are switched on and the switch 39 is also switched on, charges of $C_O(V_X - V_{REF}/2)$ are held in the capacitor 40 where $C_O$ indicates the capacitance of the capacitor 40. In this manner, the analog input signal is held in the capacitor 40 during the successive approximation.

Then, to compare the voltage of $V_{REF}/2$ with the input signal voltage $V_X$ first in the successive approximation, the successive approximation register 33 sends a control signal to the first and second switch controllers 34 and 36. In response to this control signal, the voltage $V_{REF}/2$ at the mid point (node a) is output to the output line 43. When the input analog signal $V_X$ is larger than $V_{REF}/2$, "1" is set to the MSB (Most Significant Bit) of the successive approximation register 33 in accordance with the output of the comparator 32, and, at the same time, the successive approximation register 33 sends a control signal to the first switch controller 34 in such a way that the first D/A converter 31 outputs a voltage of $(\frac{3}{4})V_{REF}$. When the input analog signal $V_X$ is smaller than $V_{REF}/2$, on the other hand, "0" is set to the MSB of the successive approximation register 33 in accordance with the output of the comparator 32, and, at the same time, the successive approximation register 33 sends a control signal to the first switch controller 34 in such a way that the first D/A converter 31 outputs a voltage of $(\frac{1}{4})V_{REF}$.

By repeating the above successive approximation, digital values of the upper four bits are determined and are held in the successive approximation register 33.

A description will now be given of a voltage change V(48) at the first input terminal 48 of the differential amplifier 42 in the comparison of the upper four bits. This voltage change can be expressed by the following equation (1).

$$V(48) = \{(V_{REF}/2^6)(D_1 2^5 + D_2 2^4 + D_3 2^3 + D_4 2^2) - V_X\} + (V_{REF}/2) \quad (1)$$

where $D_1$, $D_2$, $D_3$ and $D_4$ represent digital values of the MSB, the second bit, the third bit and the fourth bit, and will take a value of either "0" or "1". The digital values are kept held in the successive approximation register 33 until comparison of the remaining, lower two bits is complete.

A voltage V(49) at the second input terminal 49 of the differential amplifier 42 in the comparator 32 is biased to $V_{REF}/2$ by keeping the switch 54 in FIG. 5 on until the comparison of the upper four bits ends.

Next, the successive approximation of the lower two bits is performed. This successive approximation is carried out by supplying the output of the second D/A converter 35 to the second input terminal 49 of the differential amplifier 42. During the aforementioned comparison of the upper four bits, the switches 50, 52 and 54 are switched on while the switches 51 and 53 are switched off. Under this condition, the combined capacitor (capacitance of 4C) of the capacitors 55 to 57 is charged to 4C(Va−Vb) where Va is the voltage at the node a of the first D/A converter 31 and Vb is the voltage at the node b.

If V(48)>V(49) in the comparison of the fourth bit, "0" is set as the digital value $D_2$ of the fourth bit, switching the switches 51 and 52 on and switching the switches 50, 53 and 54 off. Accordingly, the charges accumulated in the combined capacitor are re-distributed. As a result, a voltage given by the following equation (2) appears on the output line 44.

$$Va - (\frac{1}{4})(Vb - Va) = (V_{REF}/2) - (\frac{1}{4})(V_{REF}/2^4) = (-V_{REF}/2) - (V_{REF}/2^5) \quad (2)$$

Thus, the comparison of the fifth bit can be expressed by the following equation (3).

$$V(48) - V(49) = \quad (3)$$

$$\{(V_{REF}/2^6)(D_1 2^5 + D_2 2^4 + D_3 2^3 + D_4 2^2) - V_X + (V_{REF}/2)\} -$$

$$(V_{REF}/2) - (V_{REF}/2^5) =$$

$$(V_{REF}/2^6)(D_1 2^5 + D_2 2^4 + D_3 2^3 + D_4 2^2) + (V_{REF}/2^5) - V_X =$$

$$(V_{REF}/2^6)(D_1 2^5 + D_2 2^4 + D_3 2^3 + D_4 2^2 + D_5 2^1) - V_X$$

where $D_5$ represents the result of the comparison of the fifth bit. If V(48)>V(49), $D_5$ will be set to "0". If V(48)<V(49), on the other hand, $D_5$ will be set to "1".

Then, comparison of the LSB (Least Significant Bit) is executed. If $D_5$ is "0", the switches 50 and 53 are switched on, and the switches 51, 52 and 54 switched off. At this time, a voltage of $Va - \{(Vb - Va)/4\} = (-V_{REF}/2) - (V_{REF}/2^6)$ appears on the output line 44. Thus, the comparison of the LSB is expressed by the following equation (4).

$$V(48) - V(49) = \quad (4)$$

$$\{(V_{REF}/2^6)(D_1 2^5 + D_2 2^4 + D_3 2^3 + D_4 2^2) - V_X + (V_{REF}/2)\} -$$

$$(V_{REF}/2) - (V_{REF}/2^5) =$$

$$(V_{REF}/2^6)(D_1 2^5 + D_2 2^4 + D_3 2^3 + D_4 2^2) + (V_{REF}/2^5) - V_X =$$

$$(V_{REF}/2^6)(D_1 2^5 + D_2 2^4 + D_3 2^3 + D_4 2^2 + D_5 2^1) - V_X$$

If $D_5$ is "1" on the other hand, the switches 51 and 53 are switched on, and the switches 50, 52 and 54 switched off. At this time, a voltage of $Va - \{3(Vb - Va)/4\} = (V_{REF}/2) - (3V_{REF}/2^6)$ appears on the output line 44. Thus, the comparison of the LSB is expressed by the following equation (5).

$$V(48) - V(49) = \quad (5)$$

$$\{(V_{REF}/2^6)(D_1 2^5 + D_2 2^4 + D_3 2^3 + D_4 2^2) - V_X + (V_{REF}/2)\} -$$

$$(V_{REF}/2) - (V_{REF}/2^5) =$$

$$(V_{REF}/2^6)(D_1 2^5 + D_2 2^4 + D_3 2^3 + D_4 2^2) + (V_{REF}/2^5) - V_X =$$

$$(V_{REF}/2^6)(D_1 2^5 + D_2 2^4 + D_3 2^3 + D_4 2^2 + D_5 2^1) - V_X$$

where $D_6$ represents the result of the successive approximation of the LSB. If V(48)>V(49), $D_6$ will be set to "0". If V(48)<V(49), on the other hand, $D_6$ will be set to "1".

The digital values $D_1$, $D_2$, ..., and $D_6$ of the analog input signal $V_X$ are determined in the above manner.

A second embodiment of this invention will briefly be described below referring to FIG. 6, which is a circuit diagram showing the first and second D/A converters 31 and 35. As shown in FIG. 6, the reference-voltage supplying lines 45 and 46 of the second D/A converter 35 are connected via buffer amplifiers 72 and 73 to the nodes a and b of the string of the resistors 60 of the first D/A converter 31, respectively. As the output resistance of the reference voltage source decreases by those buffer amplifiers 72 and 73, the time required for the re-distribution of the charges by the binary-weighted capacitors 66 is shortened. This ensure faster conversion. If the precision of the buffer amplifiers 72 and 73 is poor, an offset voltage may be produced. This offset voltage will not substantially affect the comparison since the offset voltage can be canceled by laying out the buffer amplifiers 72 and 73 in such a way that they have a better matching property.

What is claimed is:

1. An analog/digital converter for converting an analog input signal into (M+N) bits of a digital signal (M and N being each a natural number), the analog/digital converter comprising:
   a first digital/analog converter including a first resistor string having unit resistors connected in series, and first switch means for selecting individual taps of said first resistor string and generating a first output signal of M bits as a reference to be compared with the analog input signal;

reference-voltage supplying means for supplying voltages at both ends of an arbitrary one of said unit resistors in said first resistor string as reference voltages;

a second digital/analog converter coupled to said reference-voltage supplying means and including N bits binary-weighted capacitive elements and second switch means for selectively connecting said binary-weighted capacitive elements to said reference-voltage supplying means to generate a second output signal;

a comparator for comparing said analog input signal with said first and second output signals of said first and second digital/analog converters;

a first controller, operatively connected to an output of said comparator and said first digital/analog converter, for controlling said first digital/analog converter in accordance with an output of said comparator so as to perform analog/digital conversion for upper M bits of said (M+N) bits with said first output signal of said first digital/analog converter; and a second controller, operatively connected to said output of said comparator and said second digital/analog converter, for controlling said second digital/analog converter in accordance with said output of said comparator so as to perform analog/digital conversion for lower N bits of said (M+N) bits with said second output signal of said second digital/analog converter.

2. The analog/digital converter according to claim 1, wherein said second digital/analog converter uses voltages at both ends of that unit resistor which is located at a center of said first resistor string as said reference voltages.

3. The analog/digital converter according to claim 1, wherein said comparator includes:

a capacitive element for sampling and holding said analog input signal;

a differential amplifier having a first input terminal to which said capacitive element is connected, and a second input terminal supplied with said second output signal of said second digital/analog converter; and a switch connected between said first and second input terminals of said differential amplifier.

4. The analog/digital converter according to claim 1, further comprising a successive approximation register for storing the output of said comparator, wherein said first and second controllers control said first and second digital/analog converters in accordance with an output of said successive approximation register.

5. The analog/digital converter according to claim 1, wherein said reference voltages of said second digital/analog converter are voltages at both ends of an arbitrary of said unit resistors in said first resistor string supplied via buffer amplifiers having a gain of 1.

6. An analog/digital converter comprising:

an M-bit resistor-string type digital/analog converter including a resistor string having unit resistors connected in series;

a charge re-distribution type N-bit digital/analog converter which uses voltages at both ends of an arbitrary unit resistor in said resistor string as reference voltages;

a comparator for comparing analog input signal with output signals of said first and second digital/analog converters;

first and second controllers for respectively controlling the two digital/analog converters in accordance with the output of said comparator.

7. The analog/digital converter according to claim 6, further comprising a successive approximation register for storing the output of said comparator, wherein said first and second controllers control said digital/analog converters in accordance with an output of said successive approximation register.

8. The analog/digital converter according to claim 7, wherein said comparator has a capacitor for sampling an analog input signal and a differential amplifier whose one input terminal is connected to said capacitor and the other input terminal is connected to the output of said N-bit digital/analog converter.

9. An analog/digital converter for converting an analog signal into (M+N) bits of a digital signal (M and N each being a natural number), the analog/digital converter comprising:

a first digital/analog converter including a first resistor string having unit resistors connected in series, and first switch means for selecting individual taps of said first resistor string and generating a first output signal of M bits as a reference to be compared with the analog input signal;

reference-voltage supplying means for supplying voltages at both ends of an arbitrary one of said unit resistors in said first resistor string as reference voltages;

a second digital/analog converter coupled to said reference-voltage supplying means and including N bits binary-weighted capacitive elements and second switch means for selectively connecting said binary-weighted capacitive elements to said reference-voltage supplying means to generate a second output signal;

a comparator including means for receiving said analog input signal and said first and second output signals and means for comparing said analog input signal with said first and second output signals of said first and second digital/analog converters;

a first controller, operatively connected to an output of said comparator and to said first digital/analog converter, for controlling said first switch means of said first digital/analog converter in accordance with the output of said comparator for performing analog/digital conversion into upper M bits of said (M+N) bits with said first output signal of said first digital/analog converter; and a second controller, operatively connected to said output of said comparator and said second switch means of said second digital/analog converter for controlling said second switch means of said second digital/analog converter in accordance with said output of said comparator for performing analog/digital conversion into lower N bits of said (M+N) bits with said second output signal of said second digital/analog converter.

10. The analog/digital converter according to claim 9, wherein said second digital/analog converter uses voltages at both ends of that unit resistor which is located at a center of said first resistor string as said reference voltages.

11. The analog/digital converter according to claim 9, wherein said comparator includes:

a capacitive element for sampling and holding said analog input signal;

a differential amplifier having a first input terminal to which said capacitive element is connected, and a second input terminal supplied with said second output signal of said second digital/analog converter; and a switch connected between said first and second input terminals of said differential amplifier.

12. The analog/digital converter according to claim 9, further comprising a successive approximation register for storing the output of said comparator, wherein said first and second controllers control said first and second digital/analog converters in accordance with an output of said successive approximation register.

13. The analog/digital converter according to claim 9, wherein said reference voltages of said second digital/analog converter are voltages at both ends of an arbitrary of said unit resistors in said first resistor string supplied via buffer amplifiers having a gain of 1.

* * * * *